(12) United States Patent
Toda

(10) Patent No.: US 6,440,253 B1
(45) Date of Patent: Aug. 27, 2002

(54) METHOD TO FACILITATE PROCESSING OF THREE DIMENSIONAL SUBSTRATES

(75) Inventor: Risaku Toda, Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/504,334

(22) Filed: Feb. 14, 2000

(51) Int. Cl.[7] ............................................. B32B 31/14
(52) U.S. Cl. ....................... 156/247; 156/285; 156/286; 156/305
(58) Field of Search ................. 156/247, 248, 156/249, 285, 286, 305

(56) References Cited

U.S. PATENT DOCUMENTS

| 5,462,639 A | | 10/1995 | Matthews et al. ........ 156/662.1 |
| 5,897,728 A | * | 4/1999 | Cole et al. ............... 156/247 X |
| 5,955,776 A | * | 9/1999 | Ishikawa |
| 6,048,011 A | * | 4/2000 | Fruhling et al. |
| 6,061,118 A | * | 5/2000 | Takeda |
| 6,097,472 A | * | 8/2000 | Tanaka et al. |
| 6,168,638 B1 | * | 1/2001 | Kasim et al. |

FOREIGN PATENT DOCUMENTS

| JP | 02-119241 | | 10/1988 |
| JP | 11-195598 | * | 7/1999 |

* cited by examiner

Primary Examiner—Curtis Mayes
(74) Attorney, Agent, or Firm—Haynes and Boone, LLP

(57) ABSTRACT

A method and system for securing a small spherical shaped semiconductor substrate for processing operations, such as lithography, is disclosed. The substrate is secured by attaching it to a member and applying an adhering substance, such as photo resist, to the substrate and a portion of the member. The application may be by electroplating or other means. The electroplated substance securely attaches the substrate to the member so that one or more processing operations may be performed on the substrate. After processing, the substrate can be removed from the member.

13 Claims, 1 Drawing Sheet

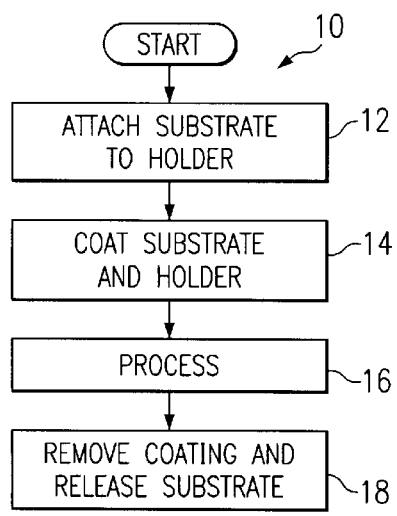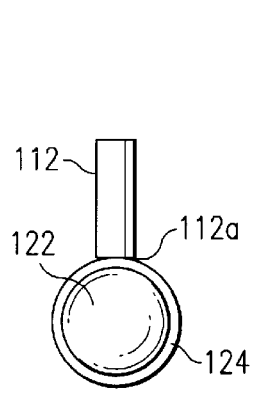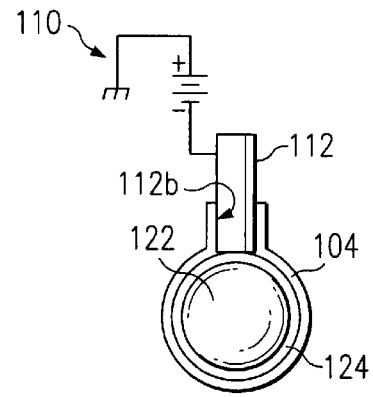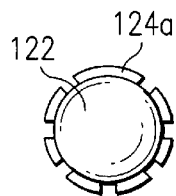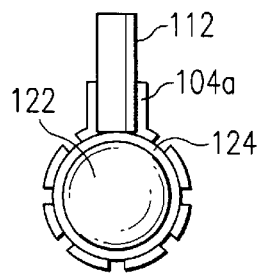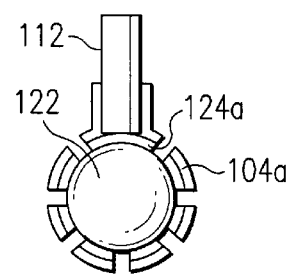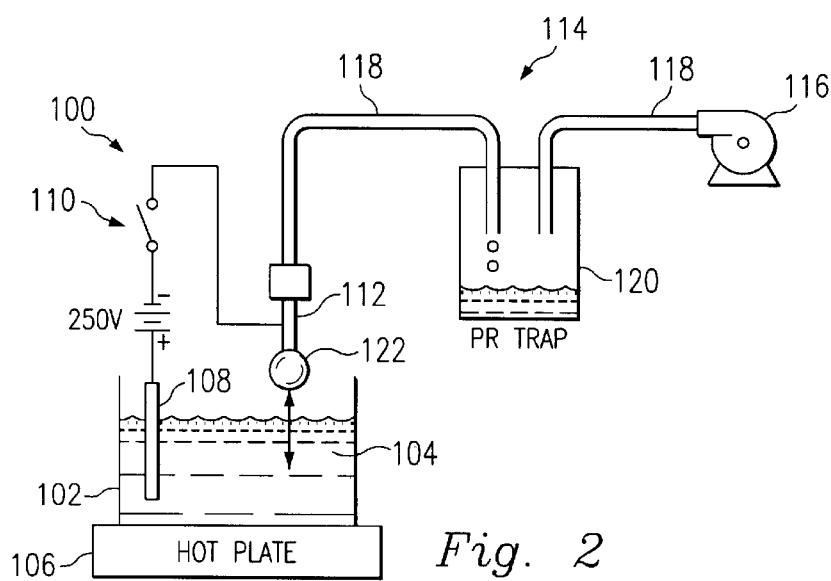

METHOD TO FACILITATE PROCESSING OF THREE DIMENSIONAL SUBSTRATES

BACKGROUND OF THE INVENTION

The invention relates generally to substrate processing, and in one embodiment, to a system and method for securing a three dimensional semiconductor substrate during one or more processing operations.

Conventional integrated circuits, or "chips", normally require processing at multiple facilities, being manufactured as flat surface semiconductor wafers in a specialized manufacturing facility, and then transferred to a fabrication facility, where several layers are processed onto the wafer. The wafer is then cut into one or more chips and assembled into packages. The enormous effort and expense required for creating perfectly flat silicon wafers hampers the process of creating chips. High manufacturing costs make the chips expensive. For example, dust-free clean rooms and temperature-controlled manufacturing and storage areas are necessary to prevent the wafers and chips from warping. Moreover, the wafers typically have some defects in spite of all the precautions taken, due to the difficulty in making a large, single, highly pure crystal.

As the demand for smaller electronic devices continues, integrated circuits must become smaller, and the above-described wafer defects will become more significant. As such, alternatives to chips will play an increasingly important role in the future. For example, U.S. Pat. No. 5,955,776, which is hereby incorporated by reference, discloses a method and apparatus for manufacturing a spherical-shaped semiconductor integrated circuit having many benefits over chips.

Spherical-shaped semiconductor fabrication includes a variety of processing steps, including deposition of films and photolithography. Many of these processing steps require that the semiconductor substrate be rigidly secured. For example, photolithography requires that the substrate be relatively still and in a predetermined location. Such securement becomes even more important as the "quality" of the photolithography increases, such as with highly intricate circuit patterns with very small critical dimensions.

Therefore, what is needed is a system and method to help secure three-dimensional substrates for processing operations such as lithography.

SUMMARY OF THE INVENTION

The present invention provides a system and method to help secure a small three dimensional substrate, such as a spherical shaped semiconductor substrate, for processing operations, such as lithography. In one embodiment, the method secures the substrate by positioning it proximate to a member and applying an adhering substance, such as photo resist, to the substrate and a portion of the member. The adhering substance securely attaches the substrate to the member so that one or more processing operations may be performed on the substrate.

In some embodiments, after processing, the adhering substance is removed to facilitate separating the member from the substrate.

In some embodiments, the substrate is positioned proximate to the member by applying a selectively attachable force between the substrate and member. For example, the selectively attachable force may be a vacuum.

In another embodiment, the method may be used for performing lithography on the spherical substrate, by releasably attaching the substrate to the member and inserting the substrate and a portion of the member into a supply of photo resist. The photo resist may then be electronically deposited to the substrate and to the portion of the member so that the photo resist rigidly secures the substrate to the member. Once rigidly secured, lithography can be performed on the spherical substrate.

In some embodiments, after performing lithography, the photo resist can be removed from the substrate and the member so that the substrate can be released from the member.

In some embodiments, the step of inserting the substrate and the member into a supply of photo resist includes submersing the substrate and the member portion into a container of the photo resist.

In some embodiments, the member may be electrically conductive and electrically connected to the substrate. In these embodiments, the step of electronically depositing may include attaching a first terminal of an electrical source to the member and a second terminal of the electrical source to the container of the photo resist. A voltage differential can thereby be created between the member and the second terminal to facilitate electro-deposition.

As a result, the substrate is secured to the member in a relatively simple and very effective way. Benefits can be seen from such a system and method by examining the attached drawings and following description.

BRIEF DESCRIPTION OF THE DRAWINGS

FIG. 1 is a flowchart of a manufacturing process for implementing one embodiment of the present invention.

FIG. 2 is a diagram of a system for use with the process of FIG. 1.

FIGS. 3a–3e are cross sectional views of a substrate and a member during various steps of the manufacturing process of FIG. 1.

DESCRIPTION OF THE EMBODIMENTS

Referring to FIG. 1, the reference numeral 10 refers, in general, to one embodiment of a manufacturing process for a three-dimensional substrate. The process 10 may be used to perform a process such as photolithography on a substrate such as a spherical shaped semiconductor. It is understood, however, that the present disclosure provides many different embodiments, or examples, for implementing different features. Techniques and requirements that are only specific to certain embodiments or certain shaped devices should not be imported into other embodiments or devices. Also, specific examples of process steps, materials, and components are described below to simplify the present disclosure. These are, of course, merely examples and are not intended to limit the invention from that described in the claims. It is further understood that the manufacturing process 10 may be an intermediate process of a larger group of processes. For example, preliminary processes may be used to create a substrate on which the manufacturing process 10 operates.

Referring also to FIG. 2, for the sake of example, the manufacturing process 10 of FIG. 1 will be discussed with an exemplary manufacturing system 100. The system 100 includes a reservoir 102 of material 104. In the present example, the material 104 may be an electro-deposition photo resist, such as PEPR 2400 from the Shipley Corporation. The reservoir 102 sits on a hot plate 106, which may also provide a stirring action to the material 104. The system 100 includes the necessary components for electroplating, including a cathode 108, a controlled voltage source 110, and an anode 112.

In the present embodiment, the anode 112 is actually part of a vacuum attachment assembly 114. The anode 112 is shaped as a hollow tube, which is connected to a vacuum pump 116 through vacuum conduits 118. In some embodiments, a vacuum trap 120 may be placed in an intermediate position in the vacuum conduits 118 to remove any material (e.g., the material 104) that may be inadvertently retrieved by the assembly 114.

The manufacturing process of FIG. 1 begins at step 12, where the substrate to be processed is attached to a holder. In the example of FIG. 2, a spherical substrate 122, such as may be produced according to presently incorporated U.S. Pat. No. 5,955,776, is attached to the anode 112 by a vacuum force. The vacuum source can be selectively turned on and off, such as through the vacuum pump 116, to efficiently attach the substrate and anode. Alternatively, some type of adhesive may be used to attach the substrate 122 and the anode 112, or the anode can simply be pressed against the substrate due to natural forces such as gravity or the surface tension of the material 104.

At step 14 of FIG. 1, the substrate and holder are coated with an adhering substance. In the example of FIG. 2, this is performed by submerging the substrate 122 and the anode 112 into the reservoir 102 of material. Once submerged, the material 104 is electroplated to the substrate 122 and the anode 112. After a predefined period of time to accommodate the electro deposition, the substrate 122 and the anode 112 are removed from the receiver 102.

At step 16 of FIG. 1, the coated substrate is processed. The process is facilitated by the adhering substance previously applied. The processing can be any operation, such as lithography and/or etching. At step 18, once the process 16 is completed, or as part of the process, the adhering substance may be removed.

FIGS. 3a–3e illustrate intermediate steps of the process 10 of FIG. 1 using the exemplary system 100 of FIG. 2. As a further example, the process step 16 of FIG. 1 will be a lithography operation on a layer of the substrate 122. It is understood, however, that other patterning operations may be used.

Referring specifically to FIG. 3a, the substrate 122 may include an outer metal layer 124. The substrate 122 is coupled to the anode 112 by forming a vacuum seal between one end 112a of the anode and the metal layer 124. The vacuum seal is also actuated by a negative pressure in the anode 112 from the pump 116 (FIG. 2).

Referring now to FIG. 3b, the substrate 122 and a portion of the anode 112 (designated with the reference numeral 112b) are electroplated with the material 104. The material 104 completely covers and hardens around the metal layer 124 and the portion 112b of the anode, thereby rigidly securing the substrate to the anode, even without the negative pressure from the pump 116 (FIG. 2). The anode 112 (with the substrate 122) can now be separated from the rest of the manufacturing system 100, if desired.

Referring now to FIG. 3c, the material 104 is patterned, such as using a photolithographic exposure process discussed in U.S. patent Ser. No. 09/350,815,now U.S. Pat. No. 6,061,118, assigned to the same assignee as the present invention and hereby incorporated by reference. For the sake of reference, the patterned material is designated with the reference numeral 104a. If only a single layer is to be patterned, there is no requirement for alignment. Otherwise, an alignment operation may be required.

Referring now to FIG. 3d, an etching process can be used to pattern the metal layer 124. The etching process may be a copper (Cu) etch, which follows the pattern on the exposed material 104a. For the sake of reference, the exposed metal layer is designated with the reference numeral 124a.

Referring now to FIG. 3e, once the metal layer 124a has been etched, the material 104a can be removed. By removing the material 104a, the substrate 122 with the etched metal layer 124a can be separated from the anode 112. Further processing can then be performed, if desired.

Thus, there has been described and illustrated herein, a system and method to facilitate processing of three dimensional substrates. It should be clearly understood, however, that various modifications, changes and substitutions are intended in the foregoing disclosure and in some instances some features of the invention will be employed without a corresponding use of other features. For example, an alignment process can be used before attaching the anode 112 to the substrate 122. The alignment process can thereby facilitate multi-layer patterns. Also, the substrate can be any shape, such as flat or cylindrical. Accordingly, it is appropriate that the appended claims be construed broadly and in a manner consistent with the scope of the invention.

What is claimed is:

1. A method for securing a substrate for a processing operation, the method comprising the steps of:

positioning the substrate proximate to a member by applying a selectively attachable force between the substrate and the member, wherein the selectively attachable force is a vacuum;

applying an adhering substance to the substrate and the member so that at least a portion of the adhering substance securely attaches the substrate to the member;

performing the processing operation on the substrate while it is attached to the member; and removing the portion of adhering substance to separate the member from the substrate.

2. The method of claim 1 wherein the substrate is spherical.

3. A method for securing a substrate for a processing operation, the method comprising the steps of:

positioning the substrate proximate to a member;

electroplating an adhering substance to the substrate and to the member, whereby the member is rigidly secured to the substrate and at least a portion of the adhering substance securely attaches the substrate to the member;

performing the processing operation on the substrate while it is attached to the member; and removing the portion of adhering substance to separate the member from the substrate.

4. A method for performing lithography on a spherical substrate, the method comprising the steps of:

releasably attaching the spherical substrate to a member, the member acting as an electrode for an electronic deposition process;

inserting the spherical substrate and a portion of the member into a supply of photo resist;

electronically depositing the photo resist to the spherical substrate and to the portion of the member so that the photo resist rigidly secures the spherical substrate to the member; and performing lithography on the spherical substrate while the substrate is rigidly secured to the member.

5. The method of claim 4 further comprising:

after performing lithography, removing the photo resist from the spherical substrate and the member; and releasing the spherical substrate from the member.

6. A method for performing lithography on a spherical substrate, the method comprising the steps of:

releasably attaching the spherical substrate to a member by applying a selectively attachable force between the substrate and member;

inserting the spherical substrate and a portion of the member into a supply of photo resist;

electronically depositing the photo resist to the spherical substrate and to the portion of the member so that the photo resist rigidly secures the spherical substrate to the member; and performing lithography on the spherical substrate while the substrate is rigidly secured to the member.

7. The method of claim 6 wherein the selectively attachable force is a vacuum.

8. The method of claim 6 wherein the photo resist is in a liquid state, and wherein the step of inserting the spherical substrate and a portion of the member into a supply of photo resist includes submersing the substrate and the member portion into a container of the liquid photo resist.

9. The method of claim 8 wherein the member is electrically conductive and electrically connected to the substrate, and the step of electronically depositing includes:

attaching a first terminal of an electrical source to the member; and attaching a second terminal of the electrical source to the container of the liquid photo resist;

whereby a voltage differential exists between the member and the second terminal.

10. A method for securing a substrate for a processing operation, the method comprising the steps of:

positioning a member proximate to the substrate;

applying a force to secure the member to the substrate;

applying a first portion of adhering substance to the substrate and a second portion of adhering substance to the member so that the combined portions of adhering substance securely attaches the substrate to the member;

releasing the force that secures the member to the substrate;

after the force is released, performing the processing operation on the substrate while it is attached to the member by the adhering substance; and removing at least the second portion of the adhering substance to separate the member from the substrate.

11. The method of claim 10 wherein the member is a hollow tube and the force is a vacuum force.

12. The method of claim 10 wherein the member is secured to the substrate at a single contact point.

13. The method of claim 10 wherein the member is electrically conductive and electrically connected to the substrate, and the step of applying the first and second portions includes:

attaching a first terminal of an electrical source to the member;

attaching a second terminal of the electrical source to a container of the adhering substance; and dipping the member and the substrate into the container of the adhering substance so that the substrate is completely immersed in the adhering substance and a portion of the member is immersed in the adhering substance;

whereby a voltage differential exists between the member and the second terminal and the voltage differential facilitates the application of the adhering substance to the substrate and the member.

* * * * *